United States Patent [19]

Kadono et al.

[11] Patent Number: 4,592,923

[45] Date of Patent: Jun. 3, 1986

[54] PRODUCTION METHOD OF A HIGH MAGNETIC PERMEABILITY FILM

[75] Inventors: Masaru Kadono, Nara; Kumio Nago, Nara; Shuuhei Tsuchimoto, Nara; Mitsuhiko Yoshikawa, Ikoma, all of Japan

[73] Assignee: Sharp Kabushiki Kaisha, Osaka, Japan

[21] Appl. No.: 664,425

[22] Filed: Oct. 24, 1984

[30] Foreign Application Priority Data

Oct. 24, 1983 [JP] Japan ............... 58-199727
Aug. 28, 1984 [JP] Japan ............... 59-181292
Aug. 29, 1984 [JP] Japan ............... 59-182087

[51] Int. Cl.$^4$ ............................................ B05D 3/06
[52] U.S. Cl. ............................ 427/35; 427/130; 427/131; 427/132; 427/250; 427/255.2
[58] Field of Search ............... 427/35, 130, 131, 132, 427/250, 255.2

[56] References Cited

U.S. PATENT DOCUMENTS 4,168,187  9/1979  Takayanagi et al. ............. 75/123 C
4,450,186  5/1984  Shinohara ............................. 427/42

Primary Examiner—Bernard D. Pianalto
Attorney, Agent, or Firm—Birch, Stewart, Kolasch & Birch

[57] ABSTRACT

A method for producing a high magnetic permeability alloy film, wherein an alloy material composed of 1-6 wt % Al, 20-35 wt % Si and the remainder of iron is irradiated with an electron beam in a vacuum deposition apparatus equipped with an electron gun, and the vapor of the alloy material is deposited on a substrate for a predetermined time to form a high magnetic permeability alloy film, comprising further a step of preventing the irregular deposition caused if the concentration of aluminum in the vapor to be deposited increases.

20 Claims, 14 Drawing Figures

○ 10.5 μm (two layer structure)
× 9.5 μm

PRODUCTION METHOD OF A HIGH MAGNETIC PERMEABILITY FILM

BACKGROUND OF THE INVENTION

1. Field of the Invention

This invention relates to a new production method of a high magnetic permeability alloy film composed of iron, aluminum, and silicon.

2. Description of Prior Art

Recently, advancement in the recording density has become necessary in the field of magnetic recording technology in order to adapt to the diversification of the information to be recorded. It has also become necessary to obtain a magnetic head having a narrower track width and a narrower gap length, and including a material of a high magnetic permeability and a high saturation magnetization.

A Sendust alloy composed of iron, aluminum and silicon has been well known to be suitable as a magnetic head material because it has a high magnetic permeability, a high saturation magnetization and good wear resistance.

It has been well known that the magnetic permeability of an alloy of the iron-aluminum-silicon system varies largely with the composition thereof. Alloys of the iron-aluminum-silicon system which shows narrow and sharp peaks of a magnetic permeability are known as Sendust alloys. A Sendust alloy for practical use is usually composed of 6 wt % Al, 9.5 wt % Si and the remainder of Fe. On producing a Sendust alloy film, the control of the composition thereof is an essential problem in order to obtain an excellent magnetic characteristics. The term "Sendust alloy" will hereinafter be referred to a high magnetic permeability alloy in a rather broad range of the composition in the iron-aluminum-silicon system.

Conventionally, the following methods have been used to produce a Sendust alloy film. (1) A process of polishing a bulk Sendust alloy into a film of a predetermined thickness. (2) A sputtering method of preparing a Sendust alloy film of a predetermined thickness. (3) A rapidly quenched method to form a Sendust alloy film. However, those methods have disadvantages as follows. As for the first method, it is difficult to cut and to dice a bulk material because of the brittleness thereof. It is also difficult to control the film thickness precisely. The second method is not appropriate to form a relatively thick film because of its very slow deposition rate. Finally, the third method does not allow control of the film thickness precisely because the film thickness is easily influenced by the processing conditions. The brittleness and the largeness of grain size of a rapidly quenched film remain still to be solved; the former causes troubles in a shaping process, and the latter limits the frequency characteristics. A rapidly quenched film is adhered with a plastic between nonmagnetic substrates in a fabrication process of a magnetic head. It is difficult to make the adherence layers as thin as possible in this process.

The inventors have already disclosed a new production method of a high magnetic permeability alloy film, wherein an alloy material composed of 1-6 wt % Al, 20-35 wt % Si and the remainder of iron is evaporated with the irradiation of an electron beam in a vacuum deposition apparatus equipped with an electron gun, and the vapor of the alloy material is deposited on a substrate for a predetermined time needed to adjust the composition of the deposited film to that of a high magnetic permeability alloy. Furthermore, it is preferable for a deposited film to be kept between 400° and 800° C. for a predetermined time for the heat treatment. The vacuum deposition process has several advantages as follows. The deposition rate is so high as to be suitable for the mass production of magnetic head cores. A deposited alloy film can be used as a magnetic head core and allows the fabrication of a magnetic head with both a narrow gap and a narrow track width without any further processing. A Sendust alloy film produced according to the present invention has superior high frequency characteristics.

However, the process should be improved in order to produce a high magnetic permeability alloy film of better quality. For example, an alloy material will be contaminated by impurities in the process of preparing a tablet thereof in a crucible under vacuum. It is also important to improve the frequency characteristics of a thick film for a magnetic head core material.

SUMMARY OF THE INVENTION

An object of the present invention is to provide a production method of a high magnetic permeability alloy film different from that of the method mentioned above.

Another object of the present invention is to provide a production method of a thick high magnetic permeability film having good high frequency characteristics.

According to this invention, we have discovered that a method for producing a high magnetic permeability alloy film, comprising (1) irradiating an alloy material composed of 1-6 wt % Al, 20-35 wt % Si and the remainder of Fe with an electron beam in order to evaporate the material under vacuum, (2) depositing the vapor on a substrate for a predetermined time on a substrate to form a high magnetic permeability alloy film thereon, and (3) preventing the irregular deposition if the concentration of aluminum in the vapor begins to increase before the predetermined time has passed, and resuming the deposition which occurs after the concentration of aluminum in the vapor begins to decrease.

According to this invention, we have discovered another method for producing a high magnetic permeability alloy film comprising (1) putting iron, silicon and aluminum deposition source materials at a predetermined position in the deposition apparatus in such a manner that the silicon and aluminum materials are covered with an iron material, (2) melting the materials with an electron beam to form an alloy material during the process of raising the input power to be applied to the electron gun, and (3) evaporating the alloy material by the irradiation of the alloy material for a predetermined time after the melting step.

According to this invention, we have discovered a method for producing a multilayer film composed of high magnetic permeability alloy layers and insulting layers interposed between two adjacent alloy layers, comprising (1) setting a plurality of alloy material composed of 1-6 wt % Al, 20-35 wt % Si and the remainder of iron, and at least one nonmagnetic material in a vacuum deposition apparatus equipped with an electron gun, (2) depositing the vapor generated by heating an alloy material with an electron beam, and (3) depositing the vapor generated by the heating of the nonmagnetic material with an electron beam, wherein the two kinds of the deposition steps being took in turn and successively to form a multilayer film.

According to this invention, we have discovered another method for producing multilayer film composed of high magnetic permeability alloy layers having an insulating layer each therebetween, comprising (1) placing first and second deposition source materials each at a predetermined position in a vacuum deposition apparatus with an electron gun, the first deposition source materials being of pure iron, pure aluminum and pure silicon each weight of which are predetermined so as to form an alloy material at a following melting step, and the second deposition source material being an insulate material, (2) melting the first deposition source materials by heating with an electron beam to form an alloy material and, successively, depositing the vapor generated by heating the alloy material with the electron beam on a substrate, and (3) evaporating the second source material by heating it with an electron beam and depositing the vapor generated on the layer, wherein the two kinds of the deposition steps being took alternatively and successively to form a multilayer film.

BRIEF DESCRIPTION OF THE DRAWINGS

The detailed description of the invention will now be described by way of examples with reference to the accompanying drawings.

DETAILED DESCRIPTION OF THE INVENTION

Figure 1:
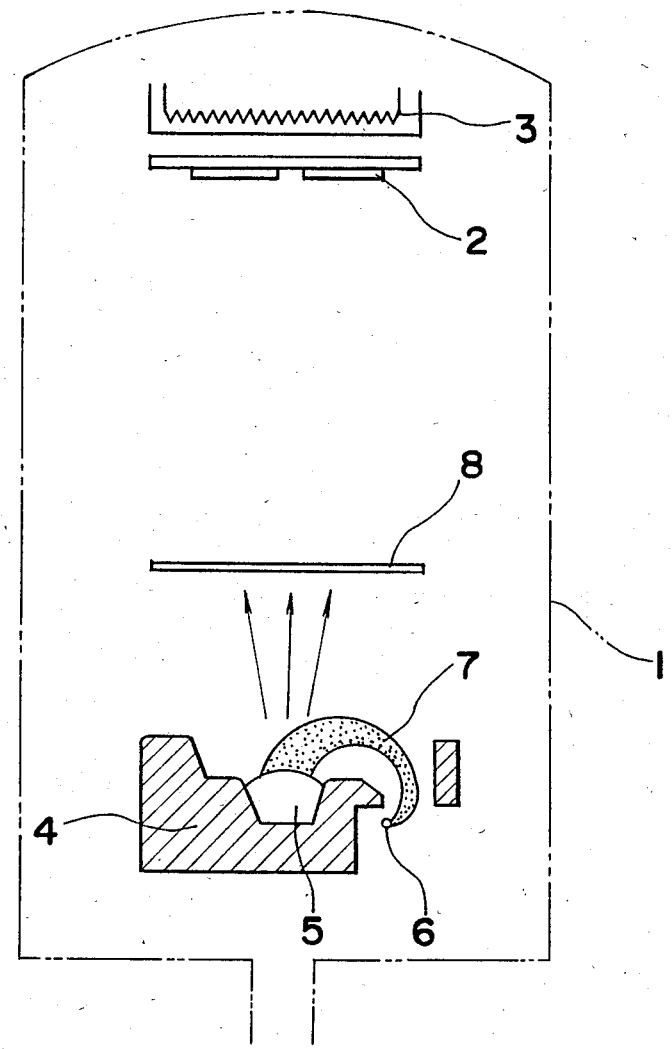
FIG. 1 is a crosssectional view of an electron beam vacuum deposition apparatus.

FIG. 1 shows schematically an electron beam deposition apparatus which has been used in following embodiments. Substrates 2 of photosensitive glass on which the vapor is to be deposited are supported in the upper space of a bell jar 1. A space inside the bell jar 1 is kept under high vacuum on deposition. A heater 3 is set near the substrates 2 in order to heat them. A hearth 4 is set at the bottom porton of the bell jar 1, and an alloy tablet 5 is placed on the hearth 4. A filament 6 is set beside the hearth 4, and an electron beam 7 generated from the filament 6 is forced to curve under magnetic field to irradiate the alloy tablet 5. A shutter 8 is provided between the substrates 2 and the hearth 4; the shutter 8 is used to control the components of an alloy film by intercepting or passing the vapor of the alloy tablet 5. The alloy tablet 5 composed of 1-6 wt % Al, 20-35 wt % Si, and the remainder of iron has been prepared by melting in vacuum. It is desirable that the substrate 2 have a thermal expansion coefficient as near as possible to that of a Sendust alloy 100-180 ($\times 10^{-7}$ deg$^{-1}$) in order to prevent thermal stress which might be induced therebetween. Therefore, following materials are suitable as a substrate: photosensitive glass such as "Photoceram" of Corning Glass Works and "PEG" series of Hoya Corp., crystalline glass, nonmagnetic ferrite, ceramics, and stainless steel (SUS 304).

EXAMPLE 1

Sendust alloy films have been prepared under following deposition conditions. A Sendust alloy film is prepared in the first deposition condition as follows. An alloy tablet 5 composed of 4 wt % Al, 27.5 wt % Si, and the remainder of Fe is put on the hearth 4. The substrates 2 are heated with the heater 3 up to 400° C. (The substrates 2 is desirably kept at a temperature between 100° and 800° C.) The input power of the electron gun during the deposition process is set at 10 kW. An electron beam is sweeped over the surface of the alloy tablet 5 in X and Y directions in order to heat the alloy tablet 5 homogeneously. The shutter 8 is kept close until three minutes pass after the input power attains 10 kW in order to intercept the deposition of the vapor onto the substrates 2. Then, the shutter 8 is opened to deposite a film on the substrate 2. A film with thickness of 4.1 $\mu$m is obtained after ten minutes.

A Sendust alloy film has also been obtained in the second deposition condition. The differences in the second deposition condition from the first one are as follows. The alloy tablet 5 is composed of 5 wt % Al, 26 wt % Si and the remainder of Fe. The deposition time is twenty minutes after the opening of the shutter 8. And the thickness of the obtained film is 7.4 $\mu$m.

In the first and second deposition conditions, the input power applied to the electron gun is reduced to 9 kW after a predetermined time in order to obtain smooth surface of the film, as will be explained later.

The characteristics of the two Sendust alloy film are almost the same with each other. The saturation magnetic flux density is 12,000 G, the Vickers hardness 600, and the electrical resistivity 85 $\mu\Omega.cm$. After a $SiO_2$ layer is applied on each Sendust film in order to protect it, it is kept at 600° C. in two hours for the heat treatment and then it is cooled down gradually. The heat treatment can not necessarily be given just after the deposition in the same deposition apparatus. (The temperature for the heat treatment can be a proper temperature between 100° and 800° C., and the time for the heat treatment is adjusted according to the temperature chosen therefor. The upper limit of the temperature is restricted by the thermal characteristics of the substrate.) The coercive force of the film thus processed is 1.7 Oe.

Figure 2:
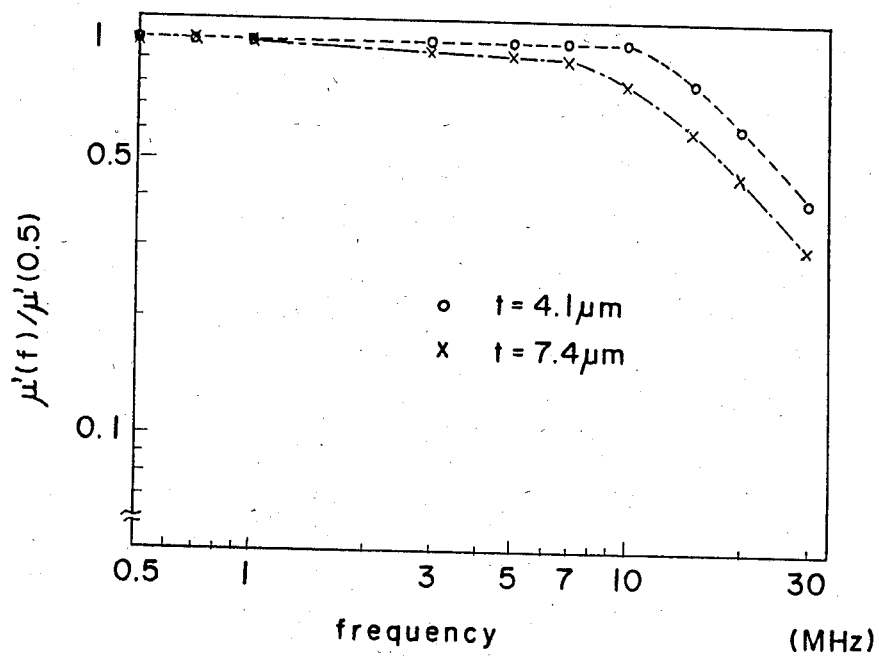
FIG. 2 is a graph of the frequency dependence of the real part of the reduced effective magnetic permeability of a film.
Figure 3:
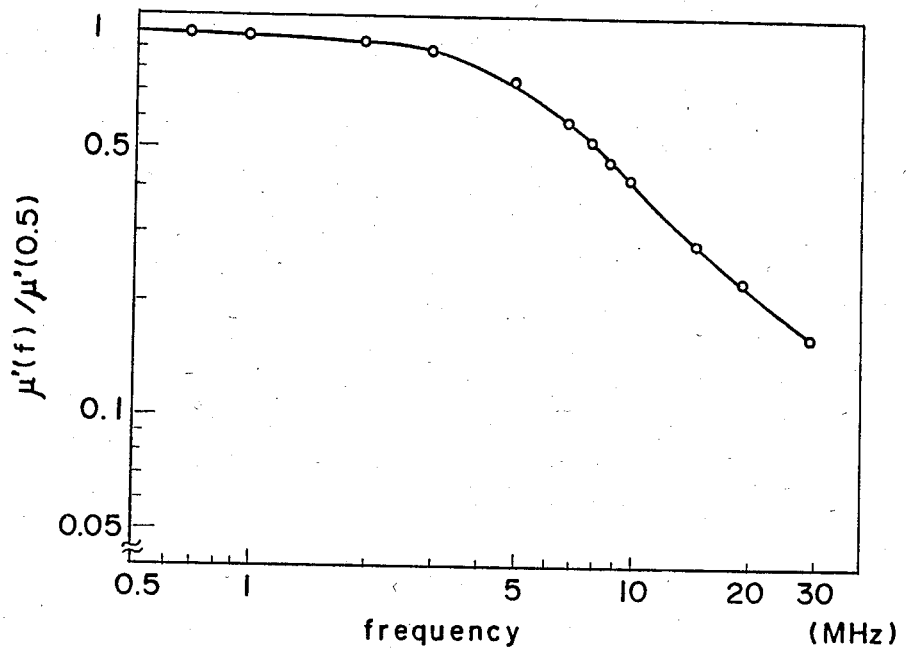
FIG. 3 is a graph of the frequency dependence of the real part of the reduced effective magnetic permeability of a film.

FIG. 2 shows the frequency dependence of the real part of the effective magnetic permeability $\mu'$ of the Sendust alloy films reduced by that at 0.5 MHz $\mu'$ (0.5).

It is apparent that the real part of the effective magnetic permeability $\mu'$ of the Sendust alloy film of thickness 7.4 $\mu$m begins to decrease at a frequency lower than the counterpart of the Sendust alloy film of thickness 4.1 $\mu$m.

EXAMPLE 2

A Sendust alloy film has been prepared in the following deposition condition. The difference in the deposition condition when compared with those of the Example 1 is the operation condition for the shutter 8. The shutter 8 is closed until two minutes have passed after the input power into the electron gun had attained 10 kW. Then, it is successively opened for six minutes, closed for six minutes, and reopened for four minutes. The thickness of the film thus deposited is 5.0 $\mu$m.

Figure 4:
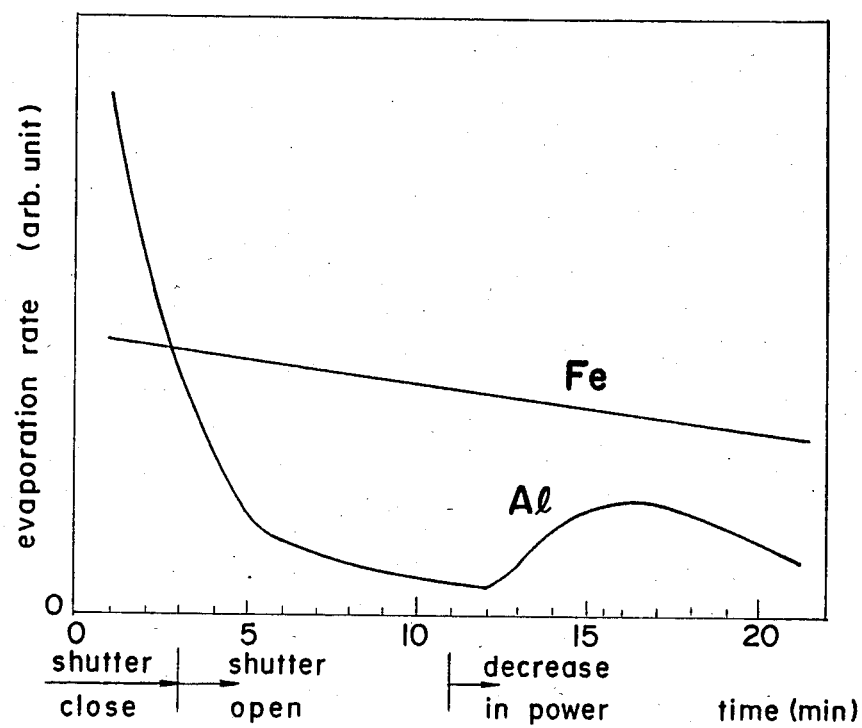
FIG. 4 is a graph of the time dependence of the evaporation rate of aluminum and of iron.

The characteristics of the Sendust alloy film thus prepared are as follows. The saturation magnetic flux density is 12,000 G, the Vickers hardness 600, and the electrical resistivity 85 $\mu\Omega$.cm. After a $SiO_2$ layer is applied on the film as a protection layer, it is kept at 600° C. for two hours for the heat treatment, and then it is cooled gradually. The coercive force of the film thus processed is 0.7 Oe. FIG. 4 shows the frequency dependence of the real part of the permeability $\mu'$ of the Sendust alloy film obtained which is reduced by that at 0.5 MHz $\mu'$ (0.5).

In Examples 1 and 2, the shutter 8 is closed for a few minutes till the input power of the electron gun attains 10 kW. The reason why the shutter should be closed at first is that the concentration of aluminum in the vapor generated by heating with an electron beam is too higher to prepare a Sendust alloy film just after the input power attains 10 kW. It is desirable to begin the deposition after the concentration of aluminum in the vapor has decreased to below 20 wt %. The timing of the opening and the length of the deposition time can be determined by the experimental data compiled in advance.

In general, factors which cause the magnetic loss in a high permeability material at high frequencies are ascribable to following losses: the hysteresis loss, the eddy current loss and the residual loss. Among them, the eddy current loss occupies a high ratio especially in an alloy material such as a Sendust alloy, and it increases with increase in thickness of the alloy film. As shown in FIG. 2, the effective permeability of a Sendust alloy film of thickness 7.4 $\mu$m begins to decrease with increase in frequency at a frequency lower than the frequency at which the permeability fo the Sendust film of thickness 4.1 $\mu$m begins to decrease. This phenomenon is supposed to be caused by the eddy current loss. Then, in order to improve the frequency characteristics of a Sendust alloy film having a relatively large thickness up to a higher frequencey, it is desirable to adopt a multilayer structure composed of thin layers of Sendust alloy films and nonmagnetic layers interposed between two Sendust alloy layers. Such a multilayer structure can be produced by successive deposition of a Sendust alloy thin film layer and a nonmagnetic film layer such as a $SiO_2$ and a $Al_2O_3$ films.

In case of producing a multilayer structure film, it is very important for each surface of Sendust alloy films to make smooth. If a nonmagnetic film and a Sendust alloy film are applied successively on a Sendust alloy layer with protrusions on its surface, an electric or magnetic short circuit may be formed between the Sendust alloy layers, and it may make the performance of a magnetic head core poor. In Examples 1 and 2, two kinds of technique are employed in order to suppress the irregular deposition so as to obtain a smooth surface of a Sendust alloy layer.

In the first kind of technique employed in Example 1, the input power of an electron gun is controlled. FIG. 4 shows an example of the time dependence of the evaporation rate of aluminum (Al) and iron (Fe), wherein the reference momont of the time is set for the moment when the input power of the electron gun attains 10 kW. The evaporation rate of iron decreases very slowly with increase in time, while that of aluminum decreases rapidly at first with the passage of time, but begins to rise when twelve minutes have passed and decreases again after about fourteen minutes have passed. The inventors have found that irregular deposition happens when the evaporation rate of the aluminum is rising after twelve minutes, and that in order to avoid such deposition, it is effective to lower the input power of the electron gun to a degree so as not to affect the deposition rate of aluminum, say down to 9 kW in Example 1. In the production of the Sendust alloy films of Example 1, the shutter 8 is opened when three minutes have passed. The input power of the electron gun is decreased for example when eleven minutes have passed a little before the evaporation rate of aluminum began to decrease. The two films thus prepared have very smooth surface. Even if the input power into the electron gun is decreased when twelve minutes has passed, that is, when the deposition rate of aluminum just begins to rise, we confirmed that the surface of the film obtained was very smooth.

Figure 5:
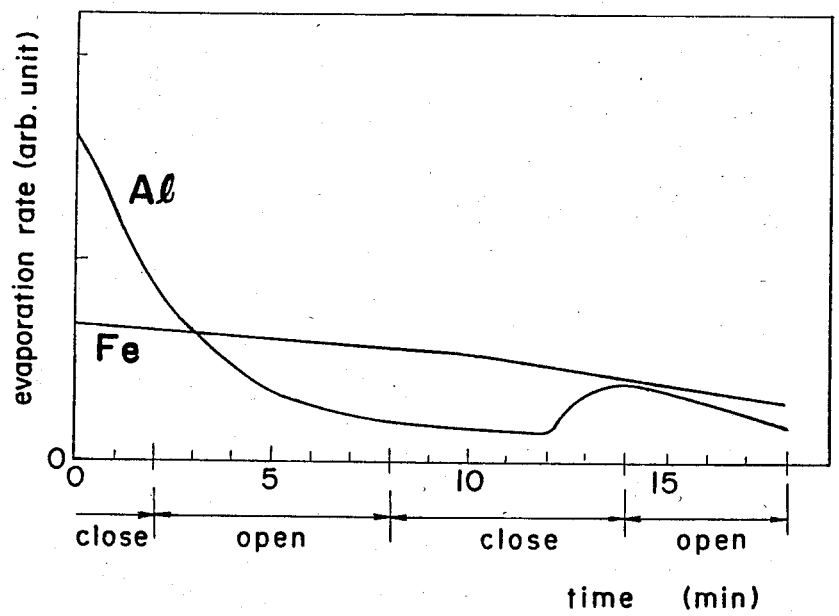
FIG. 5 is a graph of the time dependence of the evaporation rate of aluminum and of iron.

In the second kind of technique used in Example 2, the timing of the opening and closing of the shutter 8 is controlled to suspend the deposition when the evaporation rate of aluminum is increasing. FIG. 5 shows another example of the time dependence of the evaporation rate of aluminum (Al) and of iron (Fe). The reference moment from which the time is counted is the moment where the input power of the electron gun has attained 10 kW. In the preparation of the Sendust film of Example 2, the shutter 8 is opened after two minutes have passed in order to avoid the deposition before the aluminum concentration decreases below 20 wt %. The shutter 8 is closed again when eight minutes have passed, and it is opened again when thirteen minutes have passed and kept opened until eighteen minutes have passed. The reason for closing the shutter 8 for six minutes during the deposition is that possible irregular deposition which might happen can be avoided when the evaporation rate of aluminum is increasing.

The deposition time mentioned above is so controlled as to obtain a deposited film having a composition substantially the same with the best composition (the standard Sendust composition: Fe—5.5 wt % Al—9.5 wt % Si) and having a predetermined thickness 5 $\mu$m.

It should be noted that protrusions owing to the irregular deposition are observed on the surface of a film if the shutter 8 is opened for twelve minutes after two minutes have passed, that is, if the deposition continues even after the concentration of aluminum in the vapor begins to increase. On the other hand, no protrusions are observed if the shutter 8 is opened for eight minutes after two minutes have passed.

By using the abovementioned two kinds of technique, the irregular deposition is suppressed in order to avoid the formation of protrusions on the surface when the composition of aluminum of the vapor to be deposited increases, and a Sendust alloy film with a smooth surface is prepared. By adopting this process, it is also found that the deposition can be resumed again after the aluminum concentration in the vapor begin to decrease again.

It should be noted that the suppression or prevention of the irregular deposition begins when the composition of aluminum of the vapor to be deposited becomes 2 to 3 wt %, or more concretely, the shutter 8 is closed from the time at which the composition of aluminum of the vapor to be deposited decreases to a value below 3 to 5 wt %.

Then, a Sendust alloy film with a multilayer structure of good quality can be prepared by depositing in turn a Sendust alloy film and a nonmagnetic film such as $SiO_2$ film. In a method to produce a multilayer Sendust alloy film, it is preferable to evaporate Sendust alloy material and nonmagnetic material in turn successively in the same apparatus in which a high vacuum is maintained. The successive evaporation prevents the oxidation of the surface of a Sendust alloy film which deteriorates the magnetic characteristics thereof.

EXAMPLE 3

Figure 6:
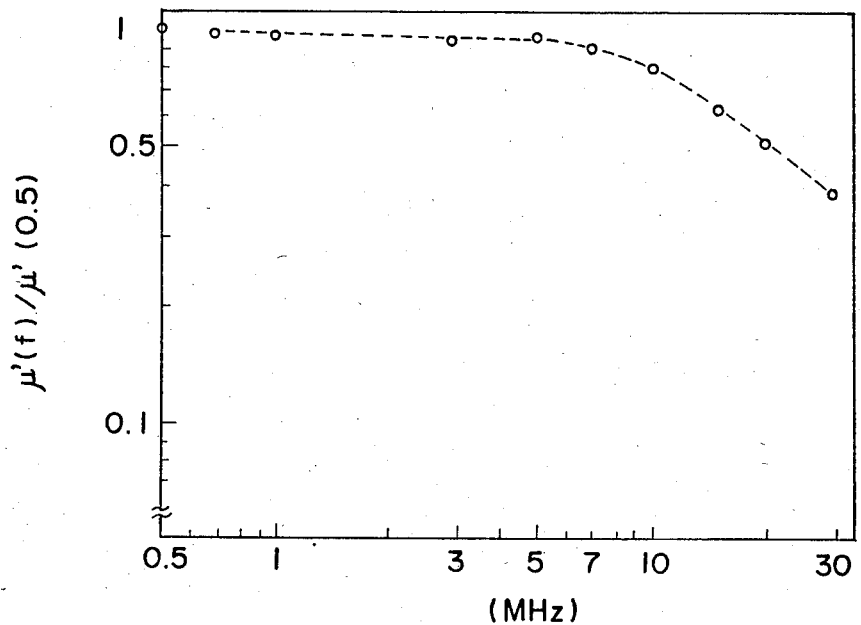
FIG. 6 is a graph of the frequency dependence of the real part of the reduced effective magnetic permeability of a film.

A multilayer Sendust alloy film of total thickness 22.5 μm is produced which is composed of three Sendust alloy layers of thickness 7.3 μm and two $SiO_2$ layers of thickness 0.3 μm interposed between adjacent Sendust alloy layers. The Sendust alloy layers are deposited under the same conditions similar to those as employed in Example 1. FIG. 6 shows the frequency dependence of the real part μ' of the effective magnetic permeability of the multilayer Sendust alloy film normalized by μ' (0.5). It is to be noted that the frequency characteristics of the multilayer film is substantially equal to those of the single layer film with thickness 7.4 μm shown in FIG. 2 though the former film is three times as thick as the latter film.

EXAMPLE 4

Figure 7:
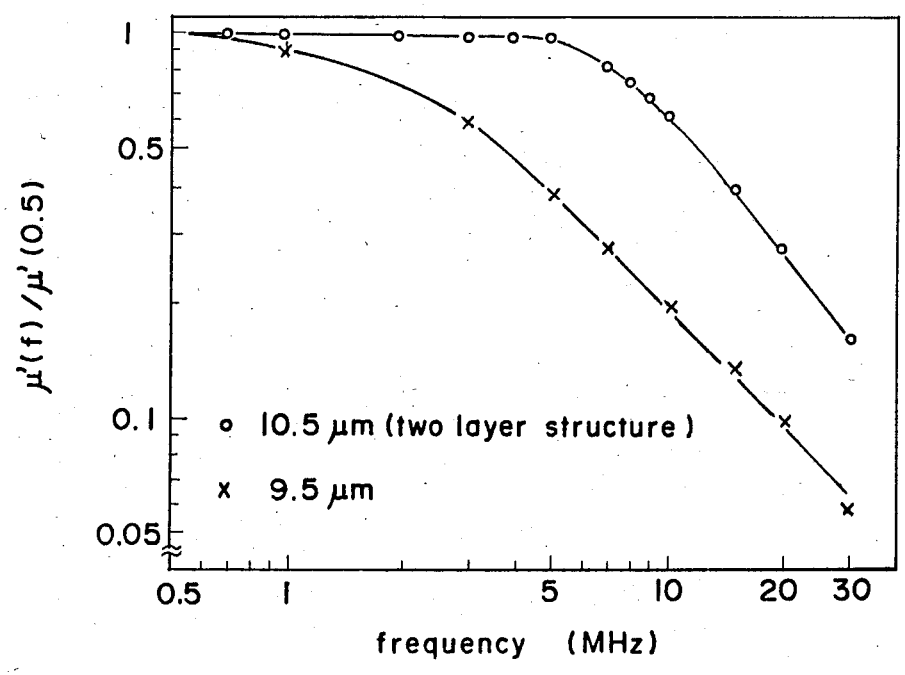
FIG. 7 is a graph of the frequency dependence of the real part of the reduced effective magnetic permeability of a film.

Another multilayer Sendust alloy film of total thickness 10.5 μm is produced to be composed of two Sendust alloy layers of thickness 5.1 μm and a $SiO_2$ layer of thickness 0.3 μm interposed between the two Sendust alloy layers. The Sendust alloy layers are deposited under the same conditions as employed in Example 2. FIG. 7 shows the frequency dependence of the real part μ' of the effective magnetic permeability of the multilayer Sendust alloy film normalized by μ' (0.5). For comparison, FIG. 7 shows the frequency dependence of the real part μ' of the effective magnetic permeability of a single layer Sendust alloy film of thickness 9.5 μm obtained according to a method similar to that as employed in Example 2. It is found that the frequency characteristics have been improved remarkably by adopting a two-layer structure.

Figure 8:
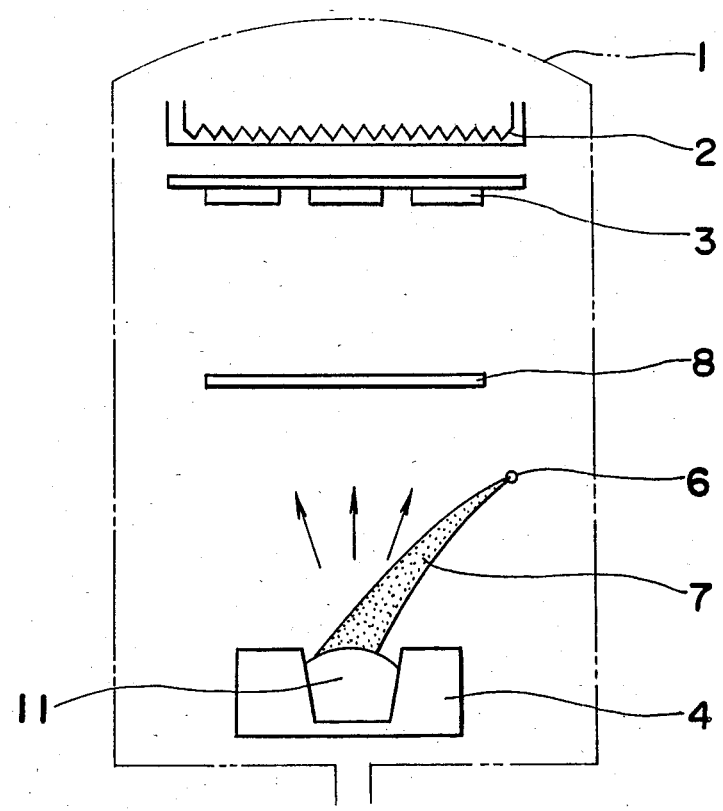
FIG. 8 is a crosssectional view of an electron beam vacuum deposition apparatus.

According to other embodiments of the present invention, an alloy material is prepared in situ in a hearth prior to the deposition. FIG. 8 shows another electron beam deposition apparatus used in following Examples. The apparatus is essentially the same as that shown in FIG. 1, but the shape of a hearth 4 and the position of a filament 5 are different from those of the latter.

Tablets 11 to be put in the hearth 7 are constituted by five layers of iron 12, aluminum 13 and silicon 14. The silicon layer 14 is interposed between two aluminum layers 13, and the three layers (13, 14, 13) are interposed between two iron layers 12. This arrangement of the five layers prevents the evaporation of aluminum 13 having the lowest melting point among the three components during the melting process prior to the reaction of aluminum 13 with iron. Thus, the three components can be melted honogeneously. The composition of the tablets 11 is limited in the range of 1–6 wt % Al, 20–35 wt % Si and the remainder of iron in order to obtain a high magnetic permeability alloy. In order to prevent the loss of aluminum on the melting, an iron layer should be on top of the others. The arrangement of another iron layer at the bottom helps to form a solid solution.

Figure 10:
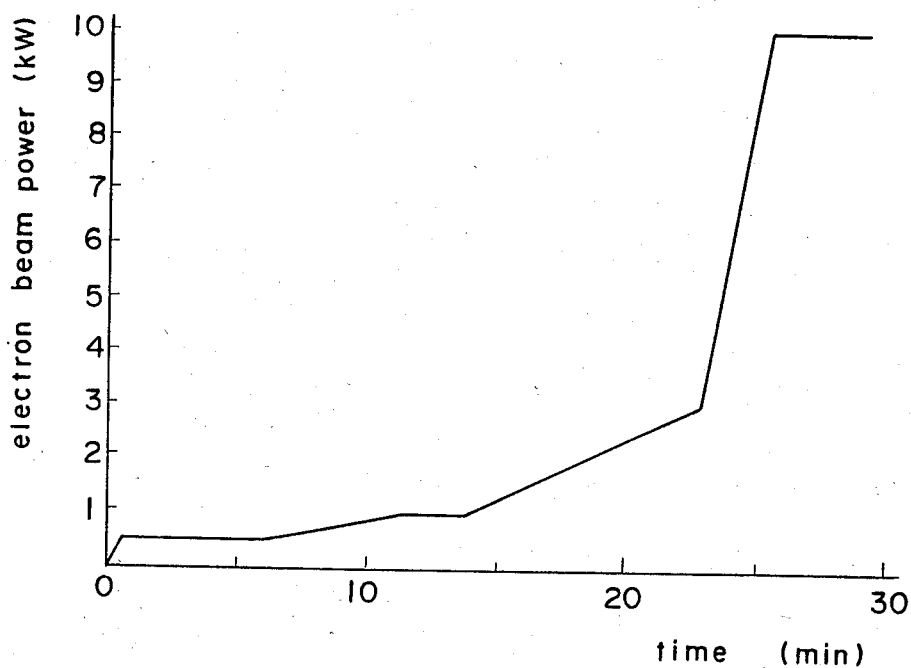
FIG. 10 is a graph of the time dependence of the electron beam power.

The tablets 11 are melted in a power-feeding soap to the filament 6 by sweeping an alloy material with an electron beam 7. In order to prevent the evaporation of aluminum 13 during the melting process, the input power of the filament is increased as shown in FIG. 10. First, the input power is kept at a value between 0.5 and 1 kW for fourteen minutes from the beginning and the tablets 11 are melted with the electron beam under vacuum. Then, the input power is increased up to 3 kW with a rate of 0.1–0.5 kW/min to make the melt homogeneous. Thus, a homogeneous alloy is formed in the hearth 7. Then, the input power is increased up to 10 kW with a rate of 2–4 kW/min for the deposition of the alloy. After the input power attains 10 kW, the shutter 8 is opened for a predetermined time, and an evaporated alloy is deposited on a nonmagnetic substrate 3.

Figure 11:
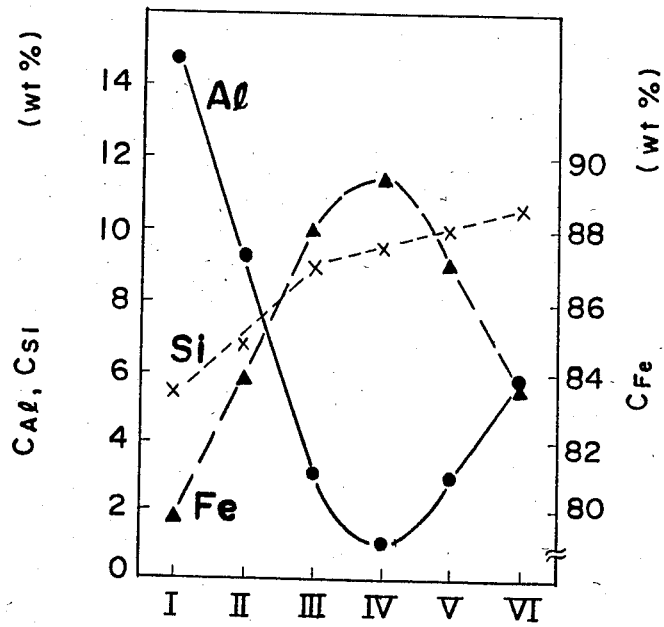
FIG. 11 is a graph of the variation of the compositions of the three components Al, Si and Fe in the direction of the thickness.

FIG. 11 shows the variation of the composition of films each obtained under six different deposition conditions denoted by I, II, III, IV, V and VI. Each of conditions I–VI is defined in the table as follows. The data show that, on the deposition of a film, the composition of a film varies in the direction of the thickness thereof because the composition of the vapor varies with time owing to the differences in the melting points and in the vapor pressures of the three components.

|     | start time* | stop time* |
| --- | --- | --- |
| I   | 1' 20"  | 3' 20"  |
| II  | 3' 20"  | 5' 50"  |
| III | 5' 50"  | 8" 50"  |
| IV  | 8' 50"  | 11' 50" |
| V   | 11' 50" | 14' 20" |
| VI  | 14' 20" | 17' 20" |

*In the table, the time is counted from the reference moment at which the input power has attained 10 kW.

EXAMPLE 5

Figure 9:
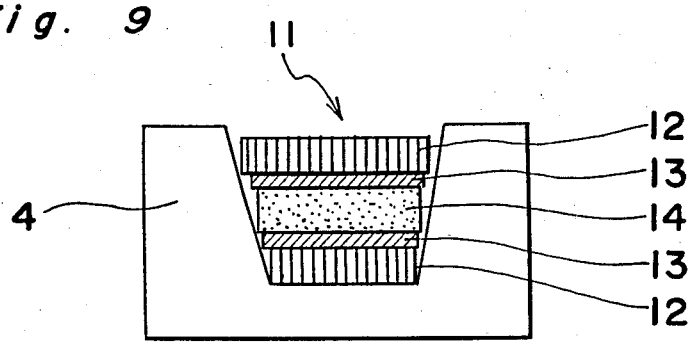
FIG. 9 is a crosssectional view of a hearth.

A magnetic head core film is obtained by using tablets 11 of the structure as shown in FIG. 9 and by adopting the input power curve shown in FIG. 10. The shutter 8 is opened when three minutes and fourty seconds have passed and it is kept opened until fifteen minutes and fourty seconds have passed after the input power had attained 10 kW, that is, after the evaporation rate of aluminum had increased again. A Sendust alloy film of thickness 5 μm is deposited on a nonmagnetic substrate 3. The chemical analysis shows that the film is composed of 85.7 wt % Fe, 9.8 wt % Si and 4.5 wt % Al. Then, the film is kept at 600° C. for two hours in vacuum for the heat treatment.

Figure 12:
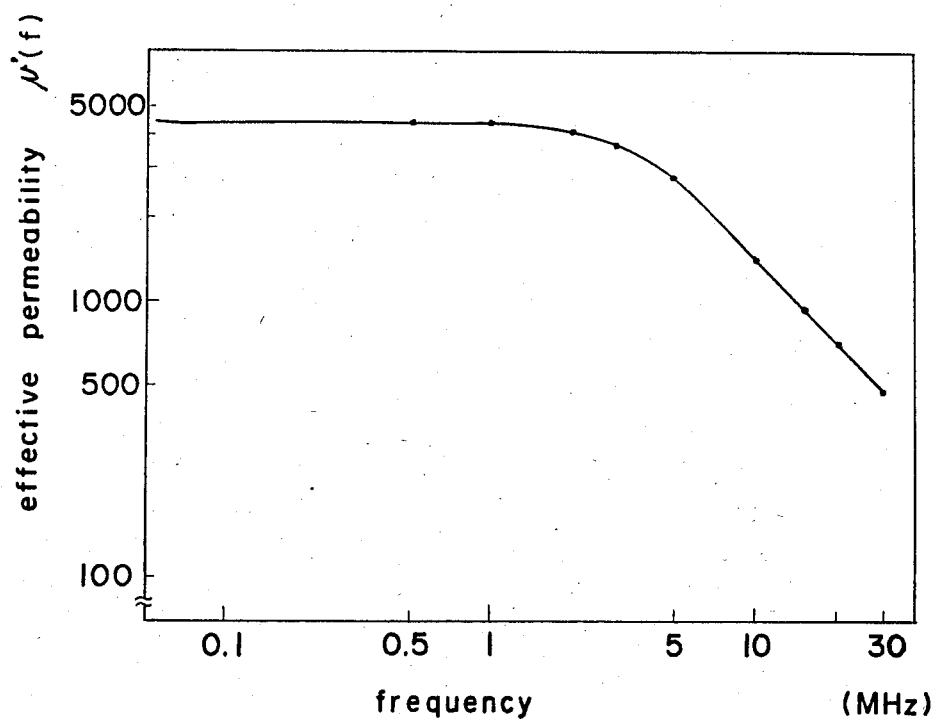
FIG. 12 is a graph of the frequency dependence of the effective magnetic permeability of a film.

The film obtained has good characteristics as a magnetic head core material. The electrical resistivity is 72 μΩ.cm, the coercive force 0.6 Oe, and the saturation magnetic flux density 11,400 G. The film is found to consist of very small grains as large as 300 Å according to an estimation from the X ray diffraction pattern with use of the Debye-Scherrer formula. FIG. 12 shows the frequency dependence of the effective magnetic permeability of the film. The effective magnetic permeability is 2,800 at 5 MHz and 1,400 at 10 MHz. The film is remarkably good as a magnetic head core material which will be used in the high frequency range.

EXAMPLE 6

Figure 13:
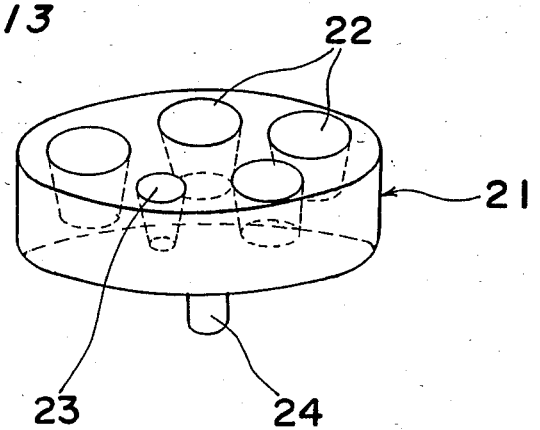
FIG. 13 is a perspective view of a hearth.

A multilayer structure film for a magnetic head core can also be obtained easily by using the in situ melting process of the tablets of the deposition source materials. FIG. 13 shows a hearth 21 wherein a plurality of pots 22 of the same size as that shown in FIG. 9 are provided for putting iron, aluminum and silicon layers therein, and a plurality of pots 23 is provided for putting an insulating material such as $SiO_2$ and $Al_2O_3$ therein; each center of those pots is arranged along a circle on the hearth 21. The hearth 21 can be rotated with an axis 24.

Five layers of iron 12, aluminum 13 and silicon 14 of the same amount used in Example 5 are put in each of pots 22 with the same arrangement as shown in FIG. 9. Then, a Sendust alloy layer of thickness 5 μm is first deposited by the same process mentioned in Example 5. The composition of the Sendust alloy is found with the chemical analysis thereof to be 85.7 wt % Fe, 9.8 wt % Si and 4.5 wt % Al. After the hearth 21 is rotated to irradiate the insulating material in a pot 23, an insulating layer of thickness about 2,000 Å is deposited on the Sendust alloy layer. By repeating the abovementioned processes, four layers of Sendust alloy and four layers of the insulating material are deposited in turn to form a high magnetic permeability magnetic head core film of the thickness of 20 μm. The multilayer film is then kept at 600° C. for two hours under vacuum for the heat treatment.

Figure 14:
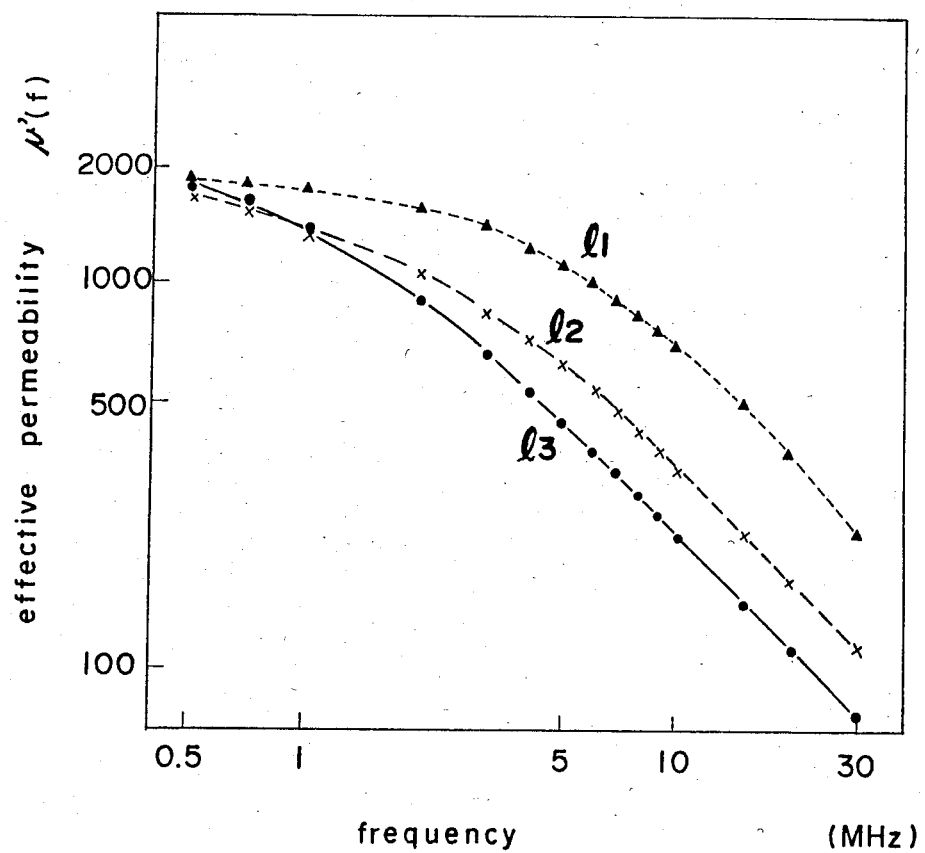
FIG. 14 is a graph of the frequency dependence of the effective magnetic permeability of a film.

The characteristics of the film obtained are as follows. The electric resistivity is 71 μΩ.cm, the coercive force 0.5 Oe, and the saturation magnetic flux density 11,000 G. FIG. 14 shows the frequency characteristics of the effective magnetic permeability of the film. The curve denoted by $l_1$ shows the effective magnetic permeability of this film, while the curves denoted by $l_2$ and $l_3$ shows for comparison that a multilayer film having single layer films of the thickness of 10 μm and a single layer film of the thickness of 20 μm, respectively. The latter films have been kept at 600° C. for ten hours for the heat treatment. It is clear that the effective permeability at 5 MHz of the former film is 1,100, and is much higher than those of the latter films. This shows that the frequency characteristics are much improved by adopting a multilayer structure of Sendust alloy.

In general, it is preferable to select the thickness of a Sendust alloy layer between about 2 and 6 μm, and to choose the deposition rate of a Sendust alloy layer between 2,000 and 5,000 Å/min. It is possible to prepare continuously a magnetic head core film of an arbitrary thickness such as 10, 20 and 30 μm in the same vacuum deposition apparatus by using a process according to the present invention.

This invention may be embodied in still other ways without departing from the spirit or essential character thereof. The embodiments described herein are therefore an illustrative and not restrictive, the scope of the invention being indicated by the appended claims and all variations which come within the meaning of the claims are intended to be embraced therein.

We claim:

1. A method for producing a high permeability alloy film comprising steps as follows:
   irradiating an alloy material composed of 1-6 wt % Al, 20-35 wt % Si and the remainder of Fe with an electron beam in order to evaporate said material under vacuum,
   depositing the vapor on a substrate for a predetermined time to form a high magnetic permeability alloy film thereon, and
   preventing the irregular deposition which takes place if the concentration of aluminum in the vapor begins to increase before said predetermined time has passed, and resuming the deposition after the concentration of aluminum in the vapor begins to decrease.

2. A method according to claim 1, wherein said step to prevent irregular deposition is a step of decreasing the input power of an electron gun to a predetermined value if the concentration of aluminum in the vapor to be deposited increases.

3. A method according to claim 1, wherein said step to prevent irregular deposition is a step of intercepting the deposition with a shutter means when the concentration of aluminum in the vapor to be deposited increases.

4. A method according to claim 1, comprising further a step that the vapor deposition on said substrate is intercepted by a shutter means until the concentration of aluminum in the vapor to be deposited has decreased to a value between 20 and about 4 wt %.

5. A method according to claim 1, comprising further a step that said film of a high magnetic permeability alloy is kept at a temperature between 100° and 800° C. for the heat treatment.

6. A method for producing a high magnetic permeability alloy film comprising steps as follows:
   putting iron, silcon and aluminum deposition source materials at a predetermined position in a deposition apparatus in such a manner that said silicon and aluminum materials are covered with said iron material,
   melting said materials with the electron beam to form an alloy material during the process of raising the input powder to be applied to the electron gun, and successively evaporating said alloy material by heating it with an electron beam, and
   depositing the vapor of said alloy material on a substrate for a predetermined time to form a high magnetic permeability alloy film thereon.

7. A method according to claim 6, wherein the weight ratios of aluminum, silicon and iron of said deposition source materials are 1-6 wt %, 20-35 wt %, and the remainder, respectively.

8. A method according to claim 6, wherein in the step of placing said deposition source materials, said iron deposition source material is positioned as a covering layer over said other deposition source materials.

9. A method according to claim 6, comprising further a step that said film of a high magnetic permeability alloy is kept at a temperature between 100° and 800° C. for the best treatment.

10. A method for producing a multilayer film composed of high magnetic permeability alloy layers having a nonmagnetic layer therebetween, comprising steps as follows:
    placing an alloy material composed of 1-6 wt % Al, 20-35 wt % Si and the remainder of iron at a predetermined position and a nonmagnetic material at another predetermined position in a vacuum deposition apparatus equipped with an electron gun, evaporating said alloy material by heating it with an electron beam and depositing the vapor generated by heating said alloy material with an electron beam on a substrate in order to form a layer, and evaporating said nonmagnetic material by heating it with an electron beam and depositing the vapor generated on said layer, wherein said two deposition steps are repeated alternatively and successively to form a multilayer film, and preventing the irregular deposition which takes place at the depositing process of said alloy material if the concentration of aluminum in the vapor begins to increase before said predetermined time has passed, and resuming the deposition after the concentration of alumimum in the vapor begins to decrease.

11. A method according to claim 10, wherein said step to prevent the irregular deposition is a step of decreasing the input power of an electron gun to a predetermined value if the concentration of aluminum in the vapor to be deposited increases.

12. A method according to claim 11, wherein, during the vapor deposition step of an alloy material, the deposition is intercepted with a shutter means until the concentration of aluminum in the vapor has decreased to a value between 20 and about 4 wt %.

13. A method according to claim 11, comprising further a step that said multilayer film is kept at a temperature between 100° and 800° C. for the heat treatment.

14. A method according to claim 10, wherein said step to prevent the irregular deposition is a step of intercepting the deposition with a shutter means when the concentration of aluminum in the vapor to be deposited increases.

15. A method according to claim 14, wherein, during the vapor deposition step of an alloy material, the deposition is intercepted with a shutter means until the concentration of aluminum in the vapor has decreased to a value between 20 and about 4 wt %.

16. A method according to claim 10, comprising further a step that the vapor deposition of an alloy material on said substrate is intercepted by a shutter means until the concentration of aluminum in the vapor to be deposited has decreased to a value between 20 and about 4 wt %.

17. A method according to claim 10, comprising further a step that said multilayer film is kept at a temperature between 100° and 800° C. for the heat treatment.

18. A method for producing a multilayer film composed of high magnetic permeability alloy layers having an insulating layer therebetween, comprising steps as follows:

placing first and second deposition source materials at a predetermined position respectively in a vacuum deposition apparatus with an electron gun, said first source materials being constituted by pure iron, pure aluminum and pure silicon each weight of which is predetermined so as to form an alloy material at a following melting step, and said second deposition source material being an insulating material, melting said first deposition source materials by heating with an electron beam to form an alloy material and, successively, depositing the vapor generated by heating said alloy material with an electron beam on a substrate in order to form a layer, and evaporating said second deposition source material by heating it with an electron beam and depositing the vapor generated on said layer, wherein said two deposition steps are repeated alternatively and successively to form a multilayer film.

19. A method according to claim 18, wherein in the step of placing the first deposition source materials, said iron material is positioned as a covering layer over said other materials.

20. A method according to claim 18, comprising further a step that said multilayer film of a high magnetic permeability alloy is kept at a temperature between 100° and 800° C. for the heat treatment.

* * * * *